(12) United States Patent
Balasubramanian et al.

(10) Patent No.: US 9,479,147 B2
(45) Date of Patent: Oct. 25, 2016

(54) SYNCHRONISER FLIP-FLOP

(71) Applicant: ARM LIMITED, Cambridge (GB)

(72) Inventors: Satheesh Balasubramanian, Bangalore (IN); James Dennis Dodrill, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/531,419

(22) Filed: Nov. 3, 2014

(65) Prior Publication Data

US 2016/0126939 A1    May 5, 2016

(51) Int. Cl.
*H03K 3/356* (2006.01)
*H03K 3/3562* (2006.01)
*H03K 3/037* (2006.01)

(52) U.S. Cl.
CPC ........ *H03K 3/35625* (2013.01); *H03K 3/0372* (2013.01)

(58) Field of Classification Search
None
See application file for complete search history.

(56) References Cited

U.S. PATENT DOCUMENTS

| 8,410,838 B2* | 4/2013 | Kato | G11C 7/04 327/199 |
| 8,416,002 B2* | 4/2013 | Liu | H03K 3/356121 327/199 |
| 2013/0147534 A1* | 6/2013 | Cheng | H03K 3/35625 327/202 |

OTHER PUBLICATIONS

S. Das et al, "A Self-Tuning DVS Processor Using Delay-Error Detection and Correction" *IEEE Journal of Solid-State Circuits*, vol. 41, No. 4, Apr. 2006, pp. 792-804.
S. Yang et al, "Synchronizer Performance in Deep Sub-Micron Technology" 17th *IEEE International Symposium on Asynchronous Circuits and Systems*, IEEE, Apr. 2011, pp. 33-42.

* cited by examiner

*Primary Examiner* — Long Nguyen
(74) *Attorney, Agent, or Firm* — Pramudji Law Group PLLC; Ari Pramudji

(57) ABSTRACT

A synchronizer flip-flop is provided, which is able to better respond to input values that are not provided for the necessary setup or hold times. The flip-flop includes a latch that includes inverter circuitry for producing a first signal and a signal in dependence on a value of an input signal at a node. A clocked inverter includes a first switch that is connected between a first reference voltage supply and an intermediate node and a second switch, which is connected between the intermediate node and a second reference voltage supply. The first switch is controlled by the first signal and the second switch is controlled by the second signal to produce an output signal at the intermediate node.

18 Claims, 6 Drawing Sheets

SYNCHRONISER FLIP-FLOP

TECHNICAL FIELD

The present disclosure relates to the technical field of flip-flops, particularly the field of synchroniser flip-flops.

DESCRIPTION OF THE PRIOR ART

A flip-flop is a data structure used for storing a bit. Typically a flip-flop comprises one or more latches. For example, a flip-flop may comprise a master latch and a slave latch. The circuitry that makes up a flip-flop can also be clocked such that different parts of the circuitry respond to a clock signal by producing an output signal based on an input signal.

In a clocked flip-flop, a data value must be stable (e.g. non-changing) at the latch for a period of time before and after an active edge of the clock signal that controls the circuitry making up the flip-flop. In particular, a set-up time is the minimum amount of time before a clock's active edge that a data value must be stable for, in order for that data value to be correctly latched. A hold time is the minimum amount of time after a clock's active edge during which the data value must be stable, in order for that data value to be correctly latched. In either case, if the presented data value is not stable for the required period of time, for example if the data value changes during these periods of time, then the circuitry making up the latch can become metastable (in which the circuitry is in an undefined state). This can take an extended period of time for the circuitry to finally enter one of the states and even then, the wrong data value can be latched. The extended period of time that it takes for the metastable state to resolve can result in a long CLK2Q time, which is the amount of time after a rising clock edge in which data is made available.

It can be difficult to provide data for the necessary set-up and hold times at asynchronous interfaces or at interfaces in which multiple clocks are used. Such interfaces often exist on external storage devices. If the external storage device is not clocked or if the external storage device uses a different clock to that of the main data processing apparatus, then the data provided to the latch might not be stable for a sufficient period of time as required according to the set-up and hold times of the latch.

It would therefore be desirable to provide a synchroniser flip-flop that is able to better handle situations in which data values are not presented to the latch for the required set-up and hold times, such that the latching of incorrect data values or extended CLK2Q delays are avoided, where possible.

SUMMARY

Viewed from a first aspect, there is provided a synchroniser flip-flop comprising a latch, the latch comprising: inverter circuitry to produce a first signal and a second signal in dependence on a value of an input signal at a node; and a clocked inverter comprising: a first switch connected between a first reference voltage supply and an intermediate node; and a second switch connected between the intermediate node and a second reference voltage supply, wherein the first switch is controlled by the first signal and the second switch is controlled by the second signal to produce an output signal at the intermediate node.

Viewed from a second aspect, there is provided a method comprising the steps: receiving an input signal from a node; inverting the input signal to produce an inverted input signal; producing a first signal and a second signal in dependence on the inverted input signal; in response to a clock signal, inverting the inverted input signal to produce an output value corresponding with the input signal by operating at least one of: a first switch using the second signal, wherein the first switch is connected between a first reference voltage supply and an intermediate node; and a second switch using the first signal, wherein the second switch is connected between the intermediate node and a second reference voltage supply.

Viewed from a third aspect, there is provided a synchroniser flip-flop comprising a latching means for latching, the latching means comprising: inverter means for producing a first signal and a second signal in dependence on a value of an input signal at a node; and a clocked inverter means for producing an output signal at an intermediate node, the clocked inverter means comprising: a first switching means for connecting the first reference voltage supply to the intermediate node in dependence on the first signal; and a second switching means for connecting the intermediate node to the second reference voltage supply in dependence on the second signal.

BRIEF DESCRIPTION OF THE DRAWINGS

The present invention will be described further, by way of example only, with reference to embodiments thereof as illustrated in the accompanying drawings, in which.

DESCRIPTION OF EXAMPLE EMBODIMENTS

Figure 1:
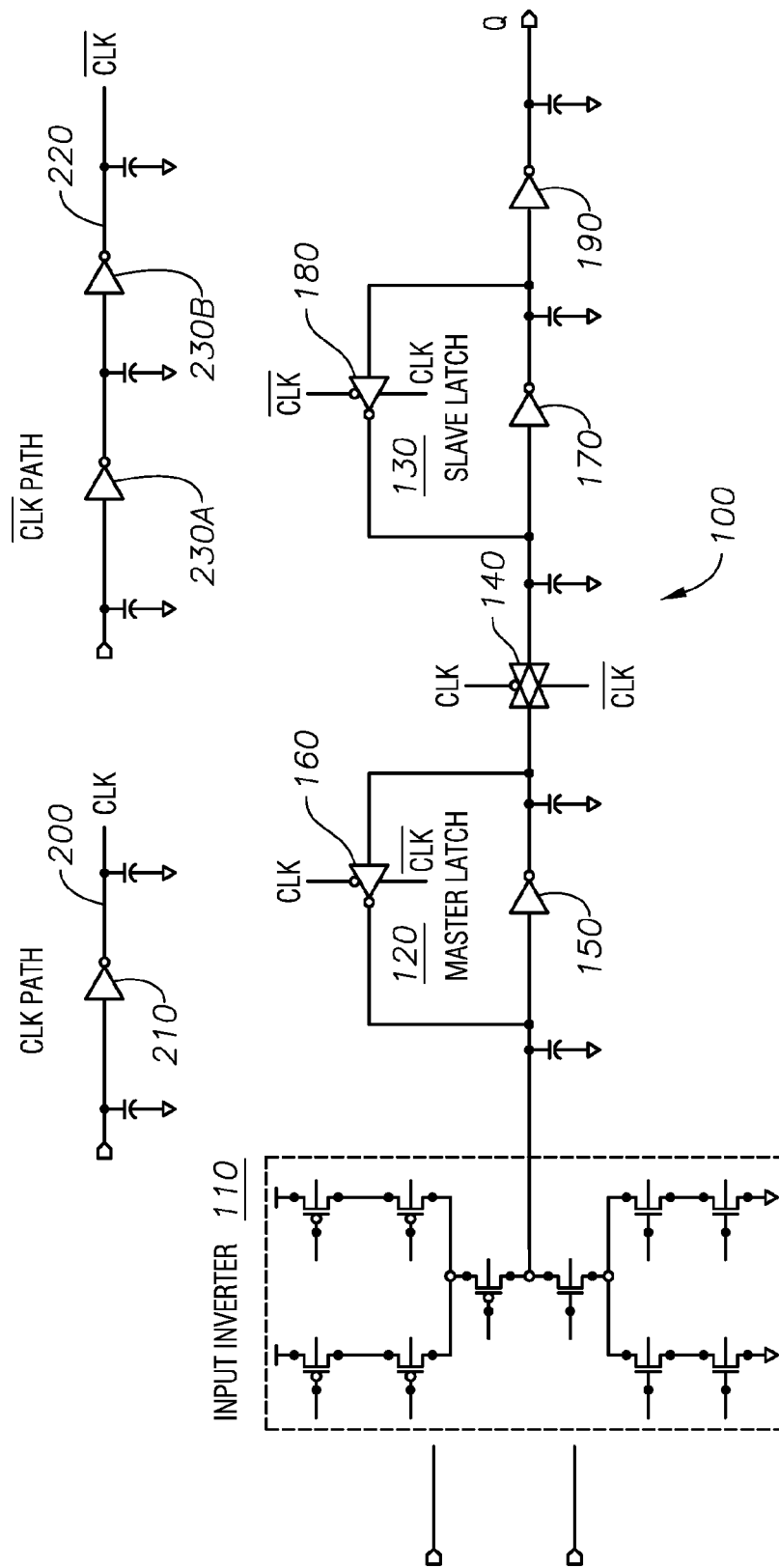
FIG. 1 is a diagram illustrating an example flip-flop as previously proposed.

In accordance with the first aspect, the inverter circuitry produces both a first signal and a second signal in dependence on a value of an input signal. The first signal and the second signal are then provided to a clocked inverter that produces an inversion of the received signals. Note that since the inverter circuitry performs an inversion operation on an input signal and produces a first signal and a second signal that are input to a clocked inverter that also performs an inversion operation, the output of the clocked inverter corresponds with the input signal provided to the inverter circuitry. Each time a signal passes through the inverter circuitry or the clocked inverter, the signal is reinforced. Consequently, the inverter circuitry and the clocked inverter collectively form a latch that can be used to store a single data value.

The inverter circuitry produces both a first signal and a second signal in dependence on a value of the input signal. By producing both a first signal and a second signal, it is possible to provide a wider range of information to the clocked inverter than would be possible with a single output from a single inverter. The clocked inverter can use this wider range of information to more readily respond to the situation in which the set-up or hold time requirements are not met. The node and the intermediate node may either be the same node or may be coupled together.

In some embodiments the inverter circuitry comprises first and second inverters whose operations are skewed with respect to each other; and the first inverter is to produce the first signal and the second inverter is to produce the second signal. When the operations of the inverter are skewed, the inverter may more readily produce a particular output value. For example, the input voltage necessary in order to produce a particular output voltage may be increased or decreased in comparison to an inverter whose operations are not skewed. Hence, by skewing the operations of the first and second inverters that make up the inverter circuitry, the resulting inverter circuitry may be more sensitive to receiving input values that are not stable for the required hold and/or set-up times.

In some embodiments, the inverter circuitry comprises a first series of inverters and a second series of inverters, the first series of inverters comprising the first inverter and at least two additional inverters, and the second series of inverters comprising the second inverter and at least two additional inverters. In such embodiments, the additional inverters may also be skewed or only a subset of the additional inverters may also be skewed.

In some embodiments, a skew of the first inverter is opposite to a skew of the second inverter. Accordingly, the inverter circuitry may comprise a first inverter skewed by a certain amount in one direction and a second inverter whose operations are skewed by the same amount in the opposite direction. Consequently, the inverter circuitry may be sensitive to a wide variety of different circumstances in which data values are presented to the inverter circuitry. In particular, the inverter circuitry may be responsive to a wide variety of set-up and hold times when the input signal corresponds to either a logical '0' or a '1'.

The first inverter may comprise a first PMOS transistor and a first NMOS transistor, wherein the first PMOS transistor is connected between the first reference voltage supply and an output node of the first inverter and wherein the first NMOS transistor is connected between the output node of the first inverter and the second reference voltage supply; and a gate of the first PMOS transistor and a gate of the first NMOS transistor may be connected to receive the input signal. Consequently, the first inverter may produce an inverse of the input signal as an output signal. However, as a result of the first inverter being skewed as compared to the second inverter, the first inverter may invert some values of the input signal better than other values.

In some embodiments, the threshold voltage of the first PMOS transistor is lower than a threshold voltage of the first NMOS transistor. Accordingly, the first inverter is skewed such that a '0' is latched more easily than a '1' is latched. In other words, a '0' may be captured by the first inverter even if the voltage of the input signal deviates from the voltage that corresponds to a logical '0'. Such a situation may arise when the set-up and/or hold times are not met.

There are a number of different ways of causing the threshold voltage of the first PMOS transistor to be lower than the threshold voltage of the first NMOS transistor. However, in some embodiments this is achieved by making a gate length of the first PMOS transistor smaller than a gate length of the first NMOS transistor. In other embodiments, this is achieved by making a gate width of the first PMOS transistor smaller than a gate width of the first NMOS transistor.

In some embodiments, the second inverter may comprise a second PMOS transistor and a second NMOS transistor, with the second PMOS transistor being connected between the first reference voltage supply and an output node of the second inverter and with the second NMOS transistor being connected between the output node of the second inverter and the second reference voltage supply; and a gate of the second PMOS transistor and a gate of the second NMOS transistor may be connected to receive the input signal. Consequently, the second inverter may produce an inverse of the input signal as an output signal. However, as a result of the second inverter being skewed as compared to the first inverter, the second inverter may invert some values better than other values.

In some embodiments, a threshold voltage of the second PMOS transistor is higher than a threshold voltage of the second NMOS transistor. Accordingly, the second inverter is skewed such that a '1' is latched more easily than a '0' is latched. In other words, even if the input voltage deviates from the voltage corresponding to a logical '1, the value of '1 will still be captured by the inverter. Such a situation may arise when the set-up and/or hold times are not met. One way of achieving this is for a gate length of the second PMOS transistor to be larger than a gate length of the second NMOS transistor.

In some embodiments, rather than changing the gate length, it is also possible to affect the threshold voltage by changing the width of the transistors. In particular, the gate width of the second PMOS transistor may be larger than a gate width of the second NMOS transistor.

The synchroniser flip-flop may comprise a further latch connected in series with the latch. Accordingly, such a flip-flop may comprise, for example, a master latch and a slave latch. By including a pair of latches in the flip-flop it is possible to configure the flip-flop so that a data value stored within the flip-flop is only changeable when a clock whose signal is used to control the clocked inverters within the latches of the flip-flop makes a transition (i.e. at a "clock edge" such as a "rising clock edge").

The further latch may comprise further inverter circuitry to produce a further first signal and a further second signal in dependence on a value of a further input signal at a further node; and a further clocked inverter comprising: a further first switch connected between the first reference voltage supply and a further intermediate node; and a further second switch connected between the further intermediate node and the second reference voltage supply, wherein the further first switch is controlled by the further first signal and the further second switch is controlled by the further second signal to produce a further output signal at the further intermediate node and the further input signal at the further node is dependent on the further output signal at the node. By including such a further latch, the latch and the further latch are each tolerant to input signals where the input signal is not provided for the required set-up and hold times. Accordingly, there is less chance of both latches in the flip-flop from entering a metastable state and so it is more likely that the input signal will be correctly latched by the flip-flop.

In some embodiments, the flip-flop may comprise delay circuitry in order to delay a received clock signal to generate a delayed clock signal, and to output the delayed clock signal to the clocked inverter. By providing a delayed clock signal to the clocked inverters, it is more likely that an input signal will be stable before the delayed clock signal causes the inverter circuitry to operate.

There are a number of ways of implementing such delay circuitry. However, in one embodiment, the delay circuitry comprises a pair of inverters. By implementing the delay circuitry using a pair inverters, it is possible to achieve the benefits of the delay circuitry without the use of significant additional or complex circuitry, which may increase the size or power consumption of the flip-flop.

In some embodiments, the delay circuitry is to output a further delayed clock signal, which is subject to a greater delay than the delayed clock signal. By providing two parallel inverter chains to generate the delayed clock signal and the further delayed clock signal, the two signals can be made to arrive at the clocked inverter as close to the same time as possible. This narrows the period of time in which the latch can enter a metastable state.

In some embodiments, a first clock switch may be used to selectively connect the first reference voltage supply to the intermediate node via the first switch, in dependence on the delayed clock signal; and a second clock switch may be used to selectively connect the second reference voltage supply to the intermediate node via the second switch, in dependence on the further delayed clock signal.

In some embodiments, the first switch is a PMOS transistor and the second switch is an NMOS transistor. The use of such MOSFETs provides an efficient method of providing switches in a digital circuit.

FIG. 1 is a circuit diagram showing a previously proposed flip-flop. The flip-flop 100 comprises an input inverter 110, a master latch 120, and a slave latch 130 in series. The master latch 120 and the slave latch 130 are separated by a pass gate 140. The pass gate 140 is controlled by the clock signal CLK and its inverse. In particular, current can only pass through the pass gate when the clock signal is asserted. The master latch 120 comprises an inverter 150 and a tri-state inverter 160. The tri-state inverter 160 inverts an input signal to produce an output signal and the inversion operation is performed in response to signal. In the embodiment shown in FIG. 1, the inversion is performed in response to the assertion of a clock signal. In particular, when a clock signal is asserted, the input is inverted in order to produce the output. The slave latch 130 has a similar configuration comprising an inverter 170 and a tri-state inverter 180. However, in the slave latch 130, the tri-state inverter 180 is clocked using the inverted clock signal and hence, the inversion operation of the tri-state inverter 180 is performed in response to a clock signal being deasserted.

As a result of the above configuration, when the clock signal is high, the master latch 120 provides its value through the pass gate 140 and the single state inverter 170 of the slave latch, causing the latched value to be output at Q. Note that an additional single state inverter 190 is provided between the slave latch 130 and the output Q in order to invert the input signal an even number of times, such that the value output at Q matches the value provided to the input inverter 110. When the clock signal is low, the pass gate 140 is disabled. Additionally, the slave latch 130 outputs its value from the tri-state inverter 180, which passes through the single state inverter 170 and the additional single state inverter 190 to Q. Consequently, when the clock signal is either high or low, the value stored in one of the master latch 120 and the slave latch 130 (which is the same), is output at Q. A new value may be latched by the flip-flop 100 when the clock signal transitions from low to high. This happens because there is a finite delay between the clock signal (CLK) being received and the inverted clock signal being received. The data in the master latch 120 gets overwritten when the clock is low and the data stored in the slave latch 130 gets overwritten when the clock is high. The value output at Q is thereafter the new value stored in the master latch 120 and the slave latch 130.

The clock signal CLK may be provided by a clock path 200 comprising an inverter 210. Similarly, the inverted clock signal may be provided by an inverted clock path 220 comprising a pair of inverters 230A, 230B connected in series. Since the inverted clock path 220 comprises an additional inverter, the value output by the inverted clock path 220 will be the inverse of the value output on the clock path 200.

Figure 2:
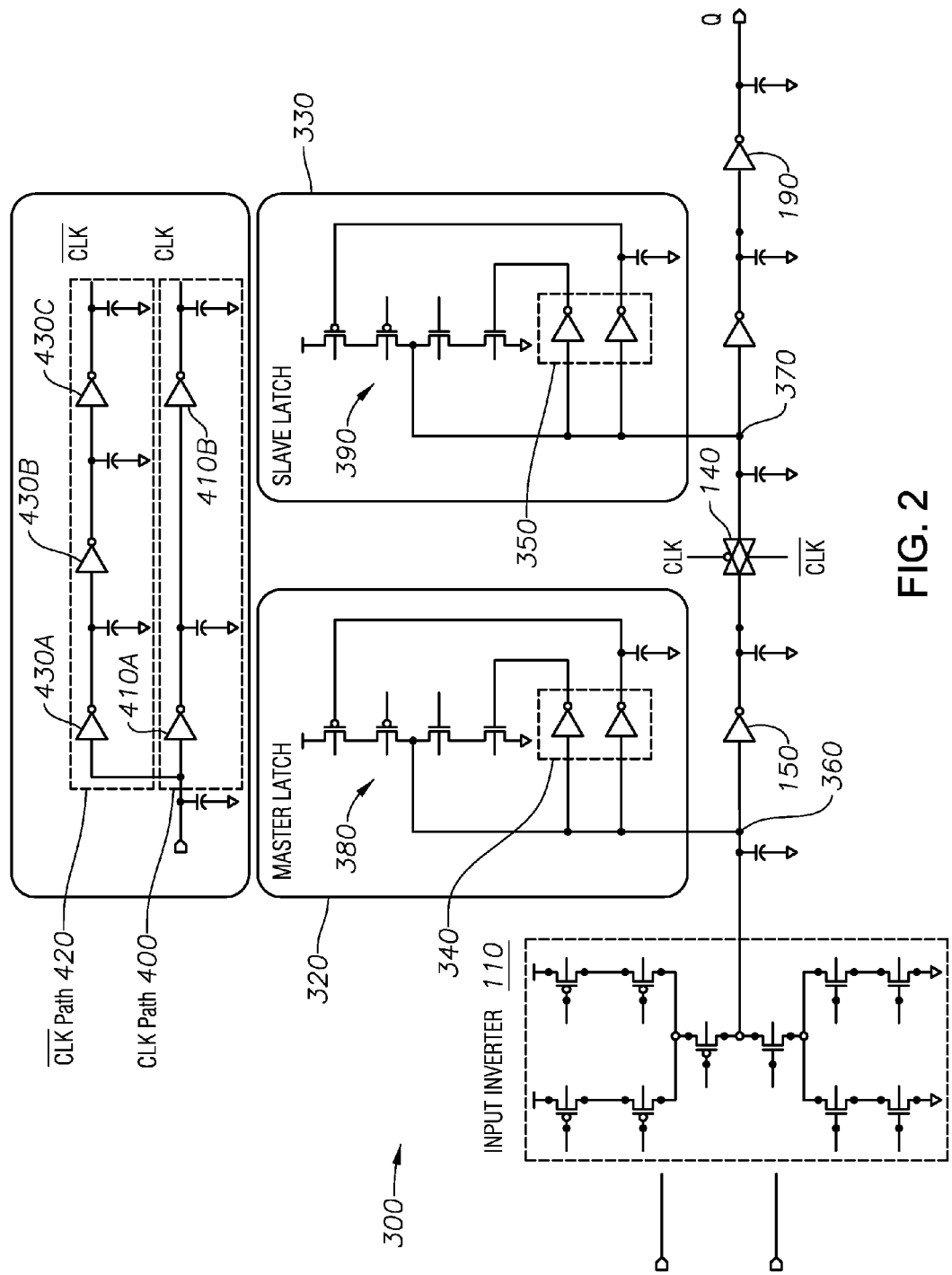
FIG. 2 shows a synchroniser flip-flop in accordance with one embodiment.

FIG. 2 shows a flip-flop 300 in accordance with one embodiment. In the embodiment of FIG. 2 a master latch 320 and a slave latch 330 are connected in series separated by a pass gate 140. A value is provided to the flip-flop 300 via an input inverter 110. The master latch 320 comprises inverter circuitry 340. The inverter circuitry 340 receives an input signal from a node 360. The inverter circuitry generates a first signal and a second signal in dependence on a value of the input signal. The first signal and the second signal are provided to a clocked inverter 380, which receives the first signal and second signal and produces an output signal to the node 360.

Similarly, the slave latch 330 receives an input signal from a further node 370. Further inverter circuitry 350 receives this input signal and produces a further first signal and further second signal, which is provided to a further clocked inverter 390. The further clocked inverter 390 uses the further first signal and further second signal to produce a further output signal to the further node 370. Each of the pass gate 140, the clocked inverter 380, and the further clocked inverter 390 is dependent on a clock signal (CLK) and an inverted clock signal. The clock signal is generated via a clock path 400, which is implemented using a first inverter 410A and a second inverter 410B. Similarly, the inverted clock signal is provided from an inverted clock path 420, which comprises a first inverter 430A, a second inverter 430B, and a third inverter 430C. Since each of the clock path 400 and the inverted clock path 420 comprises one additional inverter than is necessary, the clock signal provided to the pass gate 140, the clocked inverter 380, and the further clocked inverter 390 is delayed more than if one less inverter had been used on each of the clock path 400 and the further clock path 420. Since the clock signals are delayed, the time at which the master latch 320 and the slave latch 330 latch an incoming value is delayed. Consequently, even if a data value is provided at the input 110 later than would ordinarily be required in order for the set-up and hold times to be met, the delay of the latching process itself may mean that the input is provided at the input 110 for a sufficient period of time for the delay and set-up requirements to be met. Hence, the flip-flop 300 is more tolerant to input that are provided from, for example, an un-clocked or multi-clocked domain where the clock signals may not correspond with the clock of the device comprising the flip-flop 300. Note that additional inverters (as shown) may be provided after each of the latches in order to provide a path to the output.

Both the clock signal and its inverse are provided to the clocked inverters 380, 390 in both the master latch 320 and the slave latch 330. There is a slight delay between the clock signal and the inverted clock signal. However, by providing two parallel inverter chains to provide the clock signal and the inverted clock signal, this time can be kept small. Consequently, the opportunity for the latch to enter a metastable state may be reduced.

Figure 3:
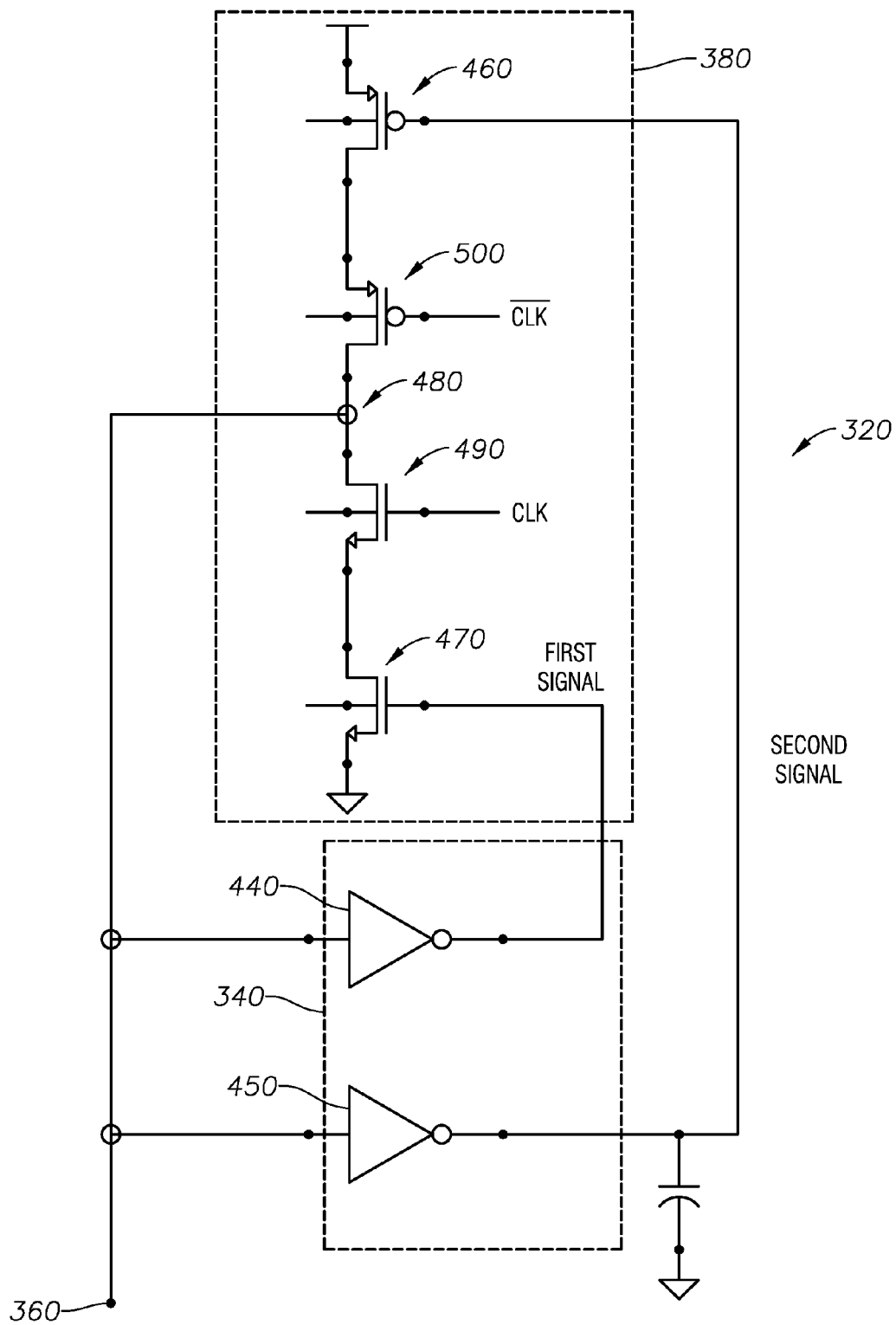
FIG. 3 is a diagram showing some of the components making up a latch of the synchroniser flip-flop in accordance with one embodiment.

FIG. 3 is a circuit diagram that shows an enlargement of the master latch 320. In addition, the circuitry as shown in the embodiment of FIG. 3 may also be suitable for use in the slave latch 330. As shown in the embodiment of FIG. 3, the inverter circuitry 340 comprises a first inverter 440 and a second inverter 450. The first inverter 440 produces a first signal and the second inverter 450 produces a second signal. The input from both the first inverter 440 and the second inverter 450 comes from the input node 360. Each of the first signal and the second signal is sent to a clocked inverter 380. In the embodiments shown in FIG. 3, each of the first inverter 440 and the second inverter 450 comprises a PMOS and an NMOS connected in series between a first voltage supply such as VDD and a second reference voltage supply such as VSS or ground. However, each of the first inverter 440 and the second inverter 450 is skewed. In particular, within each of the first inverter 440 and the second inverter 450, a gate width of the PMOS transistor and the NMOS transistor is different. For example, in the first inverter 440, a gate width of the PMOS transistor is 0.23 microns and a gate width of the NMOS transistor is 0.12 microns. Conversely, in the second inverter 450, a gate width of the PMOS transistor is 0.12 microns and a gate width of the NMOS transistor is 0.23 microns. Consequently, the first inverter 440 is able to more easily latch a zero, and the second inverter 450 is able to more easily latch a one. Accordingly, regardless of the input value at the input node 360, one of the first inverter 440 and the second inverter 450 will be able to more easily respond to the incoming value from the input node 360. Of course, since both the first inverter 440 and the second inverter 450 are inverters, the first signal and the second signal will generally match. However, it is possible that any particular instant in time, only one of the signals will be produced. In addition, in this embodiment, the Vt of each transistor is also skewed. In particular, the 0.23 micron transistor in each case was LVT whereas the 0.12 micron transistor in each case was SVT.

Figure 4:
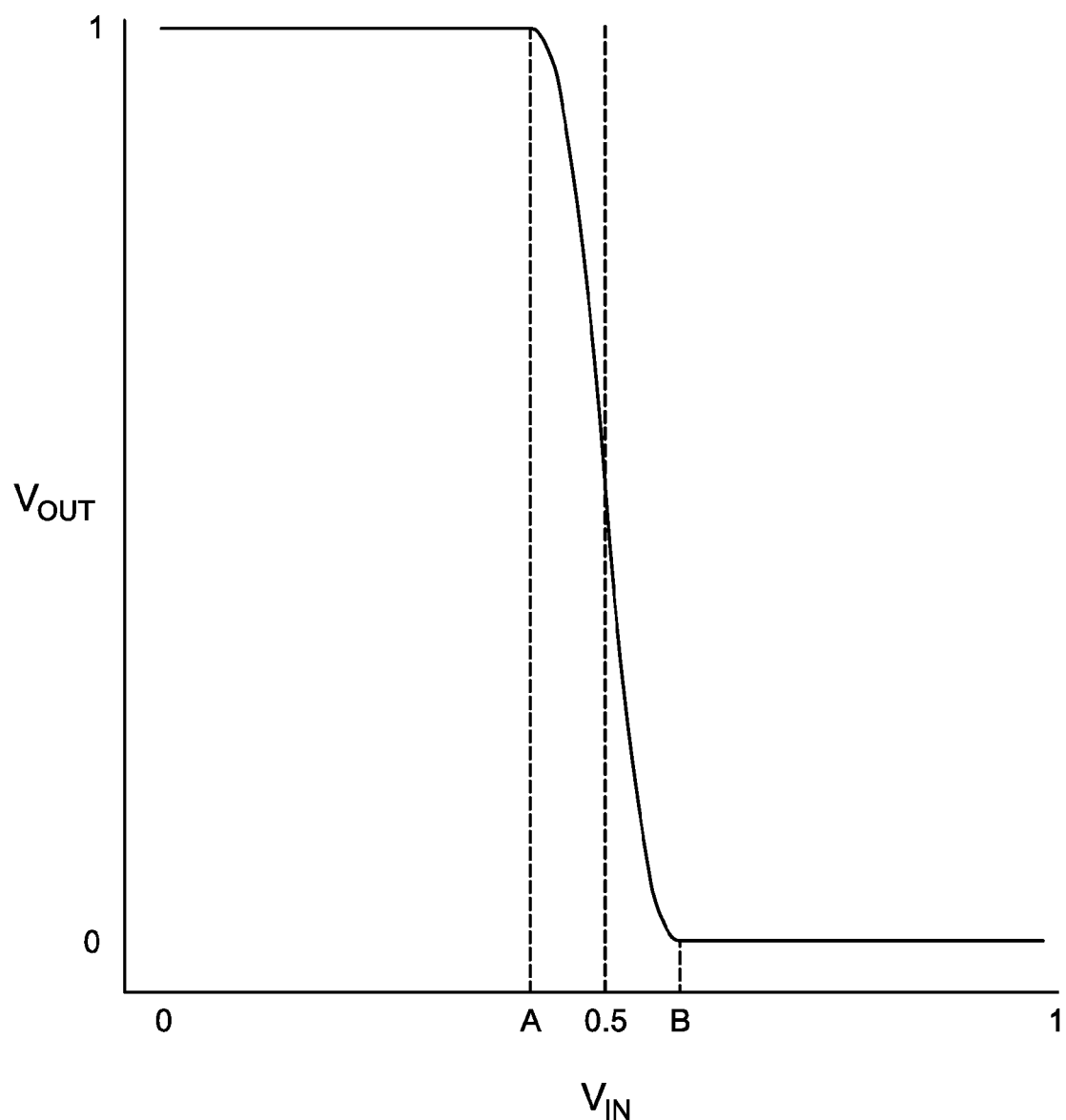
FIG. 4 is a diagram illustrating the relationship between input voltage and output voltage in an inverter.

As previously discussed, an inverter receives an incoming voltage and produces an outgoing voltage as a result. An example is shown in a graph in FIG. 4, in which the relationship between an input voltage $V_{IN}$ to an output voltage $V_{OUT}$ is shown. In general, for a low input voltage, a high output voltage is produced and vice versa. However, there is a particular set of input voltages defined by the region A-B in which the inverter is metastable. Within this region, the result is undefined and can cause the incorrect output value to be produced, and even then only after an extended period of time has passed. If an input voltage is not applied for a sufficient period of time as defined by the set-up and hold times, it is more likely that the input voltage will fall within this metastable region. The inventors of the present invention have realised that providing inverter circuitry comprising a first inverter in which this region is moved to the left together with a second inverter in which this region is moved to the right, it is possible to produce inverter circuitry comprising two inverters in which each of the inverters is able to more easily respond to a different incoming value. Accordingly, the inverter circuitry is more capable of responding to an input value that has not been supplied for the requisite set-up or hold times, regardless of its value.

Returning to the embodiment shown in FIG. 3, the first signal and the second signal are provided to the clocked inverter 380. The clocked inverter 380 comprises a first switch 460 connected between a first reference voltage supply (VDD) and a node 480. The clocked inverter circuitry 380 also comprises a second switch 470 connected between the node 480 and a second reference voltage supply (VSS). The node 480 is connected to the output node 360. The first signal is provided to the gate of the second switch 470, which is an NMOS and the second signal is provided to a gate of the first switch 460, which is a PMOS. Since the first inverter 440 is more sensitive to receiving a '0' from the input node 360, it is attached to the second switch 470, which when activated causes the node 480 to be driven to the second reference voltage (VSS). Similarly, since the second inverter 450 is more sensitive to receiving a '1' from the output node 360, it is connected to the first switch 460, which when activated causes the node 480 to be driven to the first reference voltage (VDD). Consequently, the node 480 is driven to a voltage corresponding to the voltage of the node 360. Advantageously, the latch 320 outputs a value corresponding to the input value, even if the input value is not entirely stable. In particular, as a consequence of the inverter circuitry 340, the latch 320 is able to more easily respond to a value of '0' or '1' provided at the node 360. Hence, even if a value is not stably provided at the node 360 for a period of time as required by the set-up and hold times, it is still possible for the latch 320 to latch the value.

In the embodiment of the FIG. 3, the clocked inverter 380 is controlled by a clock signal and its inverse. In particular, NMOS 490 and PMOS 500 are each controlled in dependence on a clock signal (CLK) and its inverse such that when the clock signal is asserted, the node 480 is connected to the PMOS 460 that receives the second signal and the NMOS 470 that receives the first signal. Hence, the clocked inverter 380 is only operational on the assertion of a clock signal.

Note that in the embodiment of FIG. 3, each of the first inverter 440 and the second inverter 450 are skewed in opposite manners. However, this need not be the case. In particular, one of the inverters making up the inverter circuitry 340 may be significantly better at latching one value than the other inverter is of latching the other value. For example, the first inverter 440 may be significantly better at latching a '0' than the second inverter 450 is at latching a '1'.

Figure 5:
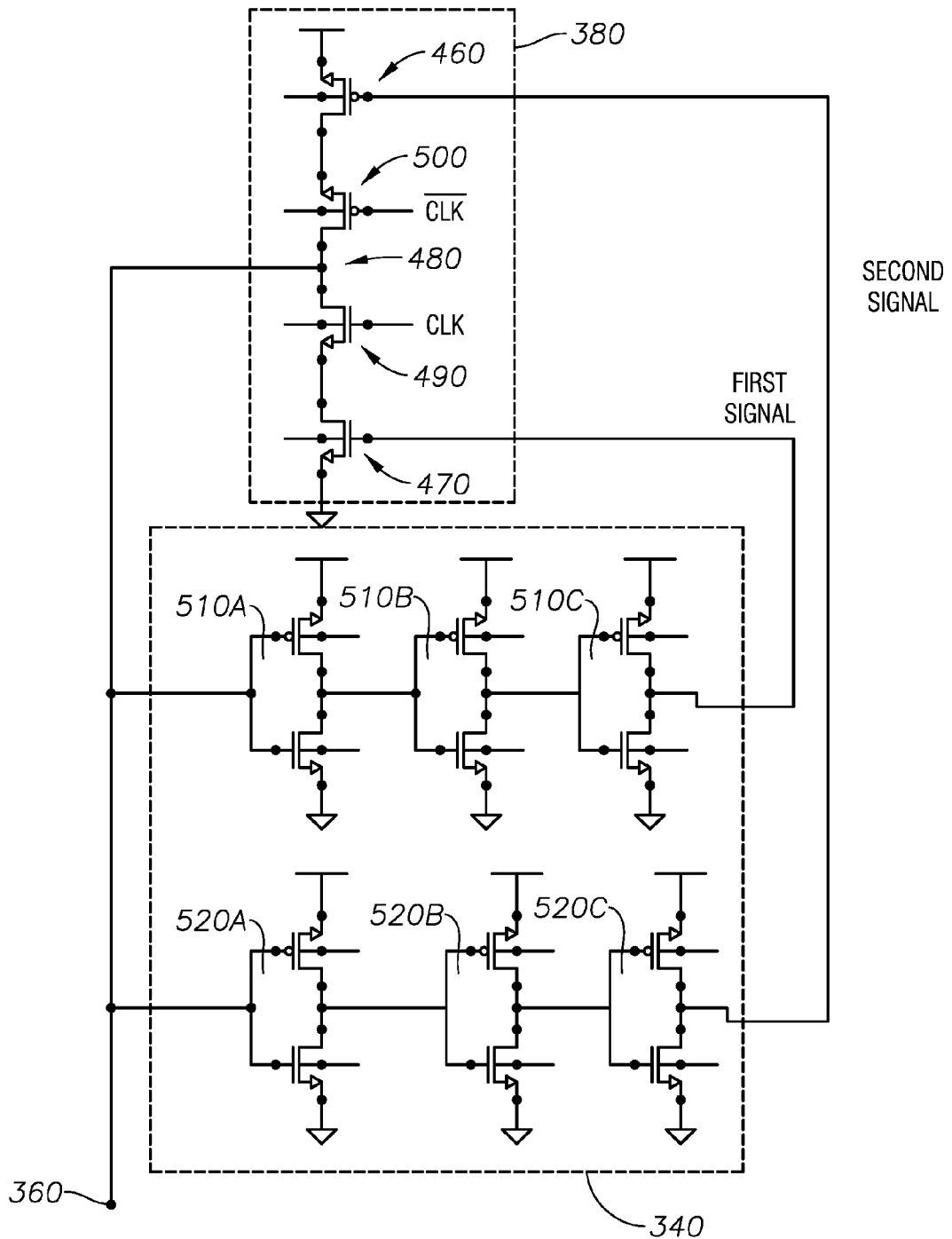
FIG. 5 is a diagram showing some of the components making up a latch of the synchroniser flip-flop in accordance with one embodiment.

FIG. 5 shows an embodiment in which the inverter circuitry 340 comprises a first series of inverters 510A, 510B, 510C and a second series of inverters 520A, 520B, 520C. In this embodiment, inverters 510A, 520B, and 510C are all skewed in the same way, which is opposite to the skew of inverters 510B, 520A, and 520C. In particular, the PMOS transistors in inverters 510A, 520B, and 510C have a larger width than the NMOS transistors in each of those inverters. Similarly, the NMOS transistors in inverters 510B, 520A, and 520C have a larger width than the PMOS transistors in those inverters. Consequently, for example, inverter 510A captures a '0' more easily than it captures a '1'. Inverter 510B has an opposite skew in order to more easily capture the inverted value from inverter 510A. In this embodiment, therefore, inverter 510B captures a '1' more easily than it captures a '0'. In other examples, there may be no skew of at least one inverter in a series of inverters.

Figure 6:
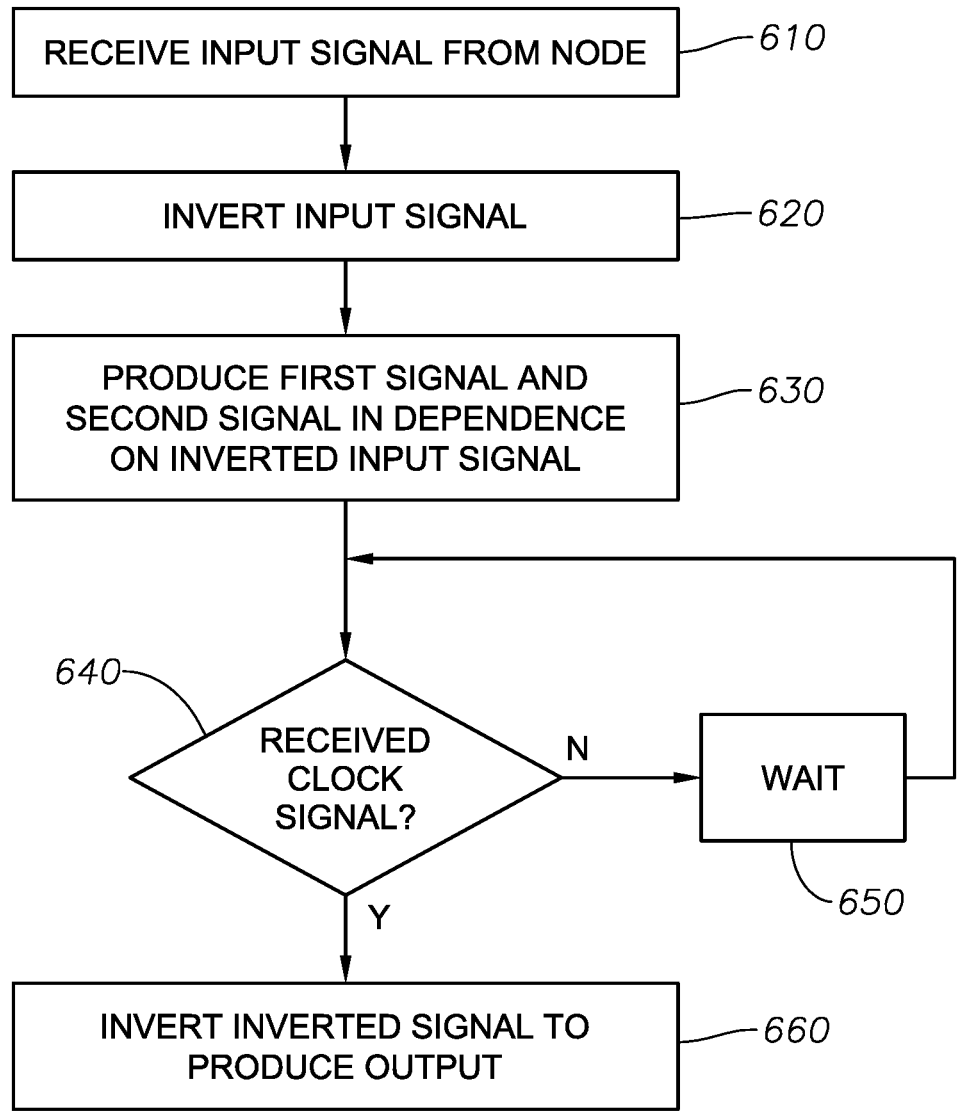
FIG. 6 shows a flow chart illustrating a method of latching and input signal in accordance with one embodiment.

FIG. 6 shows a method of operating a latch in accordance with one embodiment. At step 610 an input signal is received from a node. At step 620, the input signal is inverted in order to produce an inverted input signal. At step 630, a first signal and a second signal are produced in dependence on the inverted signal. For example, this may be carried out using a first inverter 440 and a second inverter 450 in inverter circuitry 340 with the first inverter 440 and second inverter 450 being skewed in different directions such that a first signal is produced from the first inverter 440 and the second signal is produced by the second inverter 450. Flow then proceeds to step 640, where it is determined whether or not a clock signal has been received. If a clock signal has not been received, then at step 650 the process waits before returning to step 640 to check whether a clock signal has been received or not. In effect, steps 640 and 650 cause the method to wait until a clock signal has been received. Once a clock signal has been received, then at step 660 the inverted input signal is inverted again in order to produce an output signal whose value corresponds with a value of the input signal. The inverted input signal is inverted again by using at least one of a first switch and a second switch. For example, the second switch may be a PMOS 460 controlled by the second signal generated by the second inverter 450 as shown in FIG. 3 and the second switch may be an NMOS 470 controlled by the first signal that is generated by the first inverter 440 as shown in FIG. 3.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

We claim:

1. A synchroniser flip-flop comprising:
    a latch comprising:
        inverter circuitry to produce a first signal and a second signal in dependence on a value of an input signal at a node; and
        a clocked inverter comprising:
            a first switch connected between a first reference voltage supply and an intermediate node; and
            a second switch connected between the intermediate node and a second reference voltage supply, wherein the first switch is controlled by the first signal and the second switch is controlled by the second signal to produce an output signal at the intermediate node; and
    a further latch connected in series with the latch, the further latch comprising:
        further inverter circuitry to produce a further first signal and a further second signal in dependence on a value of a further input signal at a further node; and
        a further clocked inverter comprising:
            a further first switch connected between the first reference voltage supply and a further intermediate node; and
            a further second switch connected between the further intermediate node and the second reference voltage supply, wherein the further first switch is controlled by the further first signal and the further second switch is controlled by the further second signal to produce a further output signal at the further intermediate node, and wherein the further input signal at the further node is dependent on the further output signal at the further intermediate node.

2. The synchroniser flip-flop according to claim 1, wherein the inverter circuitry comprises first and second inverters whose operations are skewed with respect to each other, and wherein the first inverter is to produce the first signal and the second inverter is to produce the second signal.

3. The synchroniser flip-flop according to claim 2, wherein the inverter circuitry comprises a first series of inverters and a second series of inverters, the first series of inverters comprising the first inverter and at least two additional inverters, and the second series of inverters comprising the second inverter and at least two additional inverters.

4. The synchroniser flip-flop according to claim 2, wherein a skew of the first inverter is opposite to a skew of the second inverter.

5. The synchroniser flip-flop according to claim 2, wherein the first inverter comprises a first PMOS transistor and a first NMOS transistor, wherein the first PMOS transistor is connected between the first reference voltage supply and an output node of the first inverter, wherein the first NMOS transistor is connected between the output node of the first inverter and the second reference voltage supply and wherein a gate of the first PMOS transistor and a gate of the first NMOS transistor are connected to receive the input signal.

6. The synchroniser flip-flop according to claim 5, wherein a threshold voltage of the first PMOS transistor is lower than a threshold voltage of the first NMOS transistor.

7. The synchroniser flip-flop according to claim 6, wherein a gate length of the first PMOS transistor is smaller than a gate length of the first NMOS transistor.

8. The synchroniser flip-flop according to claim 6, wherein a gate width of the first PMOS transistor is smaller than a gate width of the first NMOS transistor.

9. The synchroniser flip-flop according to claim 2, wherein the second inverter comprises a second PMOS transistor and a second NMOS transistor, wherein the second PMOS transistor is connected between the first reference voltage supply and an output node of the second inverter, wherein the second NMOS transistor is connected between the output node of the second inverter and the second reference voltage supply, and wherein a gate of the second PMOS transistor and a gate of the second NMOS transistor are connected to receive the input signal.

10. The synchroniser flip-flop according to claim 9, wherein a threshold voltage of the second PMOS transistor is higher than a threshold voltage of the second NMOS transistor.

11. The synchroniser flip-flop according to claim 10, wherein a gate length of the second PMOS transistor is larger than a gate length of the second NMOS transistor.

12. The synchroniser flip-flop according to claim 10, wherein a gate width of the second PMOS transistor is larger than a gate width of the second NMOS transistor.

13. The synchroniser flip-flop according to claim 1, comprising delay circuitry to delay a received clock signal to generate a delayed clock signal, and to output the delayed clock signal to the clocked inverter.

14. The synchroniser flip-flop according to claim 13, wherein the delay circuitry comprises a pair of inverters.

15. The synchroniser flip-flop according to claim 13, wherein the delay circuitry is further to output a further delayed clock signal, which is subject to a greater delay than the delayed clock signal.

16. The synchroniser flip-flop according to claim 15, comprising:
    a first clock switch to selectively connect the first reference voltage supply to the intermediate node via the first switch, in dependence on the delayed clock signal; and
    a second clock switch to selectively connect the second reference voltage supply to the intermediate node via the second switch, in dependence on the further delayed clock signal.

17. A method comprising:
receiving an input signal from a node;
inverting the input signal to produce an inverted input signal;
producing a first signal and a second signal in dependence on the inverted input signal, wherein the first signal and the second signal are produced by inverter circuitry of a latch;
in response to a clock signal, producing an output value corresponding with the inverted input signal by operating at least one of:
   a first switch using the second signal, wherein the first switch is connected between a first reference voltage supply and an intermediate node; and
   a second switch using the first signal, wherein the second switch is connected between the intermediate node and a second reference voltage supply; and
receiving a further input signal from a further node;
producing a further first signal and a further second signal in dependence on the further input signal, wherein the further first signal and the further second signal are produced by further inverter circuitry of a further latch, wherein the further latch is connected in series with the latch; and
in response to the clock signal, producing a further output value corresponding with the further input signal by operating at least one of:
   a further first switch using the further second signal, wherein the further first switch is connected between the first reference voltage supply and a further intermediate node; and
   a further second switch using the further first signal, wherein the further second switch is connected between the further intermediate node and the second reference voltage supply.

18. A synchroniser flip-flop comprising:
a latching means for latching, the latching means comprising:
   inverter means for producing a first signal and a second signal in dependence on a value of an input signal at a node; and
   a clocked inverter means for producing an output signal at an intermediate node, the clocked inverter means comprising:
      a first switching means for connecting the first reference voltage supply to the intermediate node in dependence on the first signal; and
      a second switching means for connecting the intermediate node to the second reference voltage supply in dependence on the second signal; and
a further latching means connected in series with the latching means, the further latching means comprising:
   further inverter means for producing a further first signal and a further second signal in dependence on a value of a further input signal at a further node; and
   a further clocked inverter means comprising:
      a further first switching means connected between the first reference voltage supply and a further intermediate node; and
      a further second switching means connected between the further intermediate node and the second reference voltage supply, wherein the further first switching means is controlled by the further first signal and the further second switching means is controlled by the further second signal to produce a further output signal at the further intermediate node, and wherein the further input signal at the further node is dependent on the further output signal at the further intermediate node.

* * * * *